United States Patent
Kang et al.

(10) Patent No.: US 9,735,387 B2
(45) Date of Patent: *Aug. 15, 2017

(54) ORGANIC LIGHT EMITTING DIODE DISPLAY

(71) Applicant: Samsung Display Co., Ltd., Yongin-si, Gyeonggi-do (KR)

(72) Inventors: Nam Su Kang, Seoul (KR); Ji Hye Shim, Yongin-si (KR); Ji Hwan Yoon, Yongin-si (KR); Chang Ho Lee, Suwon-si (KR); Hyun Ju Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/275,196

(22) Filed: Sep. 23, 2016

(65) Prior Publication Data

US 2017/0012234 A1  Jan. 12, 2017

Related U.S. Application Data

(63) Continuation of application No. 14/659,324, filed on Mar. 16, 2015, now Pat. No. 9,466,816.

(30) Foreign Application Priority Data

Aug. 14, 2014  (KR) ......................... 10-2014-0105995

(51) Int. Cl.
*H01L 51/00* (2006.01)
*H01L 51/52* (2006.01)
*H01L 27/32* (2006.01)

(52) U.S. Cl.
CPC ...... *H01L 51/5218* (2013.01); *H01L 27/3244* (2013.01); *H01L 51/5256* (2013.01); *H01L 51/5271* (2013.01); *H01L 51/5275* (2013.01); *H01L 2251/558* (2013.01)

(58) Field of Classification Search
CPC ............. H01L 51/5218; H01L 27/3244; H01L 51/5256; H01L 51/5271; H01L 51/5275
See application file for complete search history.

(56) References Cited

U.S. PATENT DOCUMENTS

| | | | | |
|---|---|---|---|---|
| 6,690,697 B1 * | 2/2004 | Kahen | .................. | H01L 51/5262 372/39 |
| 6,853,147 B2 * | 2/2005 | Suh | ..................... | H01L 51/0013 313/504 |
| 8,546,793 B2 * | 10/2013 | Kim | ..................... | C07D 209/56 257/103 |
| 9,099,680 B2 * | 8/2015 | Ahn | ..................... | H01L 51/5268 |
| 9,178,174 B2 * | 11/2015 | Uesugi | ................ | H01L 51/5228 |

(Continued)

FOREIGN PATENT DOCUMENTS

| KR | 2001-0091666 A | 10/2001 |
|---|---|---|
| KR | 10-2005-0095099 A | 9/2005 |

(Continued)

*Primary Examiner* — Nicholas Tobergte
(74) *Attorney, Agent, or Firm* — Lewis Roca Rothgerber Christie LLP

(57) ABSTRACT

An organic light emitting display includes: a substrate; a first electrode on the substrate; an organic light emitting layer on the first electrode; a second electrode formed on the organic light emitting layer; a non-resonance reflection inducing layer on the second electrode; and a capping layer on the non-resonance reflection inducing layer.

18 Claims, 6 Drawing Sheets

(56) References Cited

U.S. PATENT DOCUMENTS

| | | | |
|---|---|---|---|
| 2005/0194896 A1* | 9/2005 | Sugita | B82Y 20/00 313/506 |
| 2006/0097264 A1* | 5/2006 | Kim | H01L 51/5265 257/72 |
| 2008/0296600 A1* | 12/2008 | Kwack | H01L 51/5265 257/98 |
| 2009/0102362 A1 | 4/2009 | Lee et al. | |
| 2009/0236624 A1* | 9/2009 | Shin | H01L 51/5218 257/98 |
| 2010/0237333 A1 | 9/2010 | Thomschke et al. | |
| 2010/0320446 A1 | 12/2010 | Kang et al. | |
| 2011/0140597 A1* | 6/2011 | Lee | H01L 51/5262 313/506 |
| 2012/0256201 A1* | 10/2012 | Lee | H01L 51/5268 257/88 |
| 2013/0181193 A1 | 7/2013 | Moon | |
| 2013/0256638 A1* | 10/2013 | Uesugi | H01L 51/5228 257/40 |
| 2015/0069341 A1* | 3/2015 | Kim | H01L 27/3267 257/40 |
| 2015/0108512 A1* | 4/2015 | Shimayama | H01L 27/3253 257/88 |

FOREIGN PATENT DOCUMENTS

| | | |
|---|---|---|
| KR | 10-2006-0042728 A | 5/2006 |
| KR | 10-2008-0073256 A | 8/2008 |
| KR | 10-2009-0039065 A | 4/2009 |
| KR | 10-2010-0036331 A | 4/2010 |
| KR | 10-1268534 B1 | 5/2013 |
| KR | 10-2014-0064349 A | 5/2014 |

* cited by examiner

ORGANIC LIGHT EMITTING DIODE DISPLAY

CROSS-REFERENCE TO RELATED APPLICATION

This application is a continuation of U.S. patent application Ser. No. 14/659,324, filed Mar. 16, 2015, which claims priority to and the benefit of Korean Patent Application No. 10-2014-0105995, filed Aug. 14, 2014, the entire content of both of which is incorporated herein by reference.

BACKGROUND

1. Field

Aspects of embodiments of the present invention relate to an organic light emitting display improved in light emission efficiency.

2. Description of the Related Art

An organic light emitting display is a self-emission display which can display images using (utilizing) organic light emitting diodes (OLEDs). The organic light emitting display is characterized by low power consumption and short response time, thereby has drawn attention in recent years.

The organic light emitting display has a multi-layer structure including the OLEDs. Because of this structure, most of light generated inside the OLEDs may not be directed to the outside and may extinguish inside the organic light emitting display. Therefore, the organic light emitting display shows low light emission efficiency. As a result, a rate of light extracted to the outside to the light generated from the OLEDs should be increased in order to enhance the light emission efficiency of the organic light emitting display.

It is to be understood that this background of the technology section is intended to provide useful background for understanding the technology and as such, the technology background section disclosed herein may include ideas, concepts or recognitions that were not part of what was known or appreciated by those skilled in the pertinent art prior to a corresponding effective filing date of the subject matter disclosed herein.

SUMMARY

The present disclosure of invention is directed to an organic light emitting display improved in light extraction efficiency.

According to an embodiment of the present invention, an organic light emitting display includes: a substrate; a first electrode on the substrate; an organic light emitting layer on the first electrode; a second electrode on the organic light emitting layer; a non-resonance reflection inducing layer on the second electrode; and a capping layer on the non-resonance reflection inducing layer.

The non-resonance reflection inducing layer may have a refractive index of 1.1 to 1.6.

The non-resonance reflection inducing layer may have a thickness of 5 nm to 10 nm.

The non-resonance reflection inducing layer may include at least one selected from the group consisting of $CaF_2$, NaF, $Na_3AlF_6$, SiOx, $AlF_3$, LiF, $MgF_2$, $Alq_3$[Tris(8-hydroxyquinolinato)aluminum], Balq[Bis(2-methyl-8-quinolinolato-N1,O8)-(1,1'-Biphenyl-4-olato)aluminum], an acrylic resin, a polyimide-based resin and a polyamide-based resin.

A difference in refractive index between the non-resonance reflection inducing layer and the capping layer may be 0.3 or more.

The capping layer may have a refractive index of 1.6 to 3.0.

The capping layer may have a thickness of 20 nm to 200 nm.

The capping layer may include at least one selected from the group consisting of tris-8-hydroxyquinoline aluminum (Alq3), ZnSe, 2,5-bis(6'-(2',2"-bipyridyl))-1,1-dimethyl-3,4-diphenylsilole, 4'-bis[N-(1-napthyl)-N-phenyl-amion]biphenyl (α-NPD), N,N'-diphenyl-N,N'-bis(3-methylphenyl)-1,1'-biphenyl-4,4'-diamine (TPD), and 1,1'-bis(di-4-tolylaminophenyl) cyclohexane (TAPC).

The first electrode may include a reflective layer and at least one transparent conductive layer on the reflective layer.

The reflective layer may include at least one of magnesium (Mg), silver (Ag), gold (Au), calcium (Ca), lithium (Li), chromium (Cr), copper (Cu) and aluminum (Al).

The transparent conductive layer may include at least one of indium tin oxides (ITO), indium zinc oxides (IZO), zinc oxides (ZnO), aluminum zinc oxides (AZO), and indium oxides ($In_2O_3$).

The organic light emitting display may satisfy Formulas 1 and 2:

$$t1 = (n1 \times \lambda1)/2 \quad \quad \text{Formula 1}$$

$$t2 = (n2 \times \lambda1)/2, \quad \quad \text{Formula 2}$$

wherein a wavelength of light emitted from the organic light emitting layer is λ1, a distance between an upper surface of the reflective layer and a lower surface of the second electrode is t1, a distance between the upper surface of the reflective layer and an upper surface of the capping layer is t2, and n1 and n2 are natural numbers.

The organic light emitting display may satisfy Formula 3:

$$(m1 \times \lambda1)/2 < t3 < [(m1+1) \times \lambda1]/2, \quad \quad \text{Formula 3}$$

wherein a wavelength of light emitted from the organic light emitting layer is λ1, a distance between an upper surface of the reflective layer and a lower surface of the capping layer is t3, and m1 is a natural number.

The organic light emitting display may further include at least one of a hole injection layer and a hole transport layer between the first electrode and the organic light emitting layer.

The organic light emitting display may further include at least one of an electron transport layer and an electron injection layer between the organic light emitting layer and the second electrode.

The organic light emitting display may further include a light extraction inducing layer on the capping layer.

The organic light emitting display may further include a thin film encapsulation layer on the capping layer.

The thin film encapsulation layer may have a structure where a plurality of inorganic layers and a plurality of organic layers are alternately laminated.

According to embodiments of the present invention, an organic light emitting display includes a non-resonance reflection inducting layer disposed between the OLED and the capping layer. Accordingly, a rate (percentage) of light emitted from the OLED to the outside is increased, thereby improving the light emission rate of the organic light emitting display.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of invention will be more clearly understood from the following detailed description taken in conjunction with the accompanying drawings, in which.

DETAILED DESCRIPTION

Figure 1:
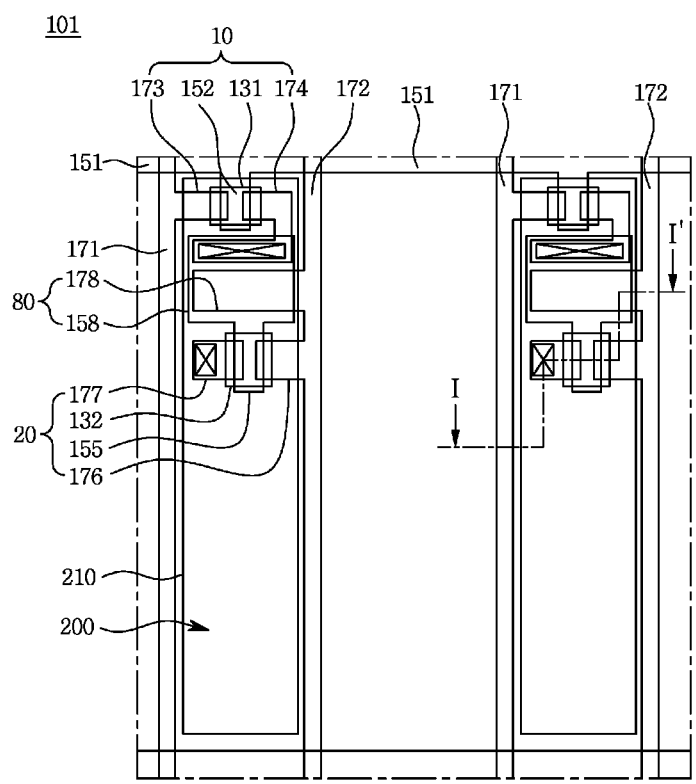
FIG. 1 is a plan view illustrating an organic light emitting display according to a first embodiment of the present invention.

Hereinafter, embodiments of the present disclosure of invention will be described in more detail with reference to the accompanying drawings. However, the scope of the embodiments of the present invention is not limited to the specific embodiments or drawings and should be construed as including all the changes, equivalents, and substitutions included in the spirit and scope of the present invention.

All terms used herein are merely used to describe embodiments of the present invention and may be modified according to the purpose of the present invention or practices known to those skilled in the pertinent art. It is to be understood that terms, such as those defined in commonly used dictionaries, should be interpreted as having a meaning that is consistent with their meaning in the context of the present application and relevant art.

In the drawings, certain elements or shapes may be simplified or exaggerated to better illustrate embodiments of the present invention, and other elements present in an actual product may also be omitted. Like reference numerals refer to like elements throughout the specification. Thus, the drawings are intended to facilitate the understanding of the present invention. Expressions such as "at least one of," when preceding a list of elements, modify the entire list of elements and do not modify the individual elements of the list. Further, the use of "may" when describing embodiments of the present invention refers to "one or more embodiments of the present invention."

In addition, when a layer or element is referred to as being "on" another layer or element, the layer or element may be directly on the other layer or element, or one or more intervening layers or elements may be interposed therebetween. Similarly, when an element is referred to as being "coupled to" or "connected to" another element or layer, the element may be directly coupled to or directly connected to the other element or layer, or one or more intervening layers or elements may be interposed therebetween.

Hereinafter, a first embodiment of the present invention will be described with reference to FIGS. 1 and 2.

Figure 2:
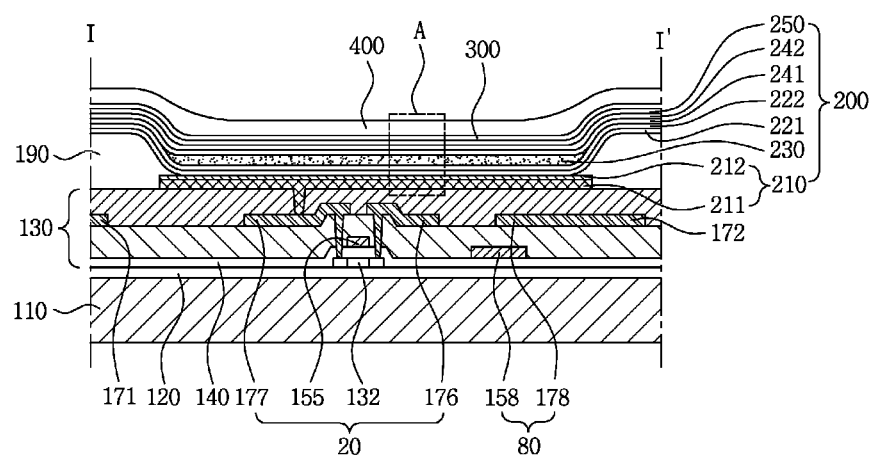
FIG. 2 is a cross-sectional view taken along the line I-I' of FIG. 1.

FIG. 1 is a plan view illustrating an organic light emitting display according to a first embodiment of the present invention and FIG. 2 is a cross-sectional view taken along the line I-I' of FIG. 1.

As illustrated in FIGS. 1 and 2, the organic light emitting display 101 according to the first embodiment may include a substrate 110, an OLED 200, a non-resonance reflection inducing layer 300, and a capping layer 400.

The first substrate 110 may be made of an insulating material, such as, for example, glass, quartz, ceramic, plastic, and/or the like. However, the first embodiment of the present invention is not limited thereto, and thus the first substrate 110 may also be made of a metal material made of stainless steel and/or the like.

A buffer layer 120 may be disposed on the first substrate 110. The buffer layer 120 may include one or more layers selected from various suitable inorganic layers and organic layers. The buffer layer 120 is configured to reduce or prevent infiltration of undesirable elements such as impurities or moisture into a wiring 130 or the OLED 200, and to planarize a surface. However, the buffer layer 120 may not always be necessary and may be omitted.

A structure including a switching thin film transistor (TFT) 10, a driving TFT 20, and a capacitor 80 is referred to as a wiring 130. The wiring 130 may be disposed on the buffer layer 120. The wiring 130 is configured to drive the OLED 200. The OLED 200 is configured to display an image by emitting light according to a driving signal transmitted from the wiring 130.

Although FIGS. 1 and 2 illustrate an active-matrix (AM) OLED display having a 2Tr-1Cap structure, which includes two thin film transistors TFTs 10 and 20 and a capacitor 80 in one pixel, embodiments of the present invention are not limited thereto. For example, the organic light emitting display 101 may have many different structures including three or more TFTs and two or more capacitors in one pixel, and may further include additional lines. Herein, the term "pixel" refers to the smallest unit for displaying an image, and the organic light emitting display 101 may display an image using (utilizing) a plurality of pixels.

Each of the pixels may include the switching TFT 10, the driving TFT 20, the capacitor 80, and the OLED 200. In addition, the wiring 130 may include a gate line 151 arranged along one direction and a data line 171 and a common power line 172 insulated from and crossing the gate line 151. Herein, one pixel may be generally defined by the gate line 151, the data line 171, and the common power line 172, but is not limited thereto. Thus, the pixel may also be defined by the pixel defining layer PDL.

The OLED 200 may include a first electrode 210, an organic light emitting layer 230 formed on the first electrode 210, and a second electrode 250 formed on the organic light emitting layer 230. In the OLED, holes and electrons are respectively injected from the first and second electrodes 210 and 250 into the organic light emitting layer 230. The injected holes and electrons are combined with each other to form excitons, and the OLED emits light by energy generated when the excitons fall from an excited state to a ground state.

The capacitor 80 may include a pair of capacitor plates 158 and 178 with an interlayer insulating layer 160 interposed therebetween. Herein, the interlayer insulating layer 160 may be a dielectric material. Capacitance of the capacitor 80 may be determined by electric charges stored in the capacitor 80 and the voltage across the pair of capacitor plates 158 and 178.

The switching TFT 10 may include a switching semiconductor layer 131, a switching gate electrode 152, a switching source electrode 173, and a switching drain electrode 174. The driving TFT 20 may include a driving semiconductor layer 132, a driving gate electrode 155, a driving source electrode 176, and a driving drain electrode 177. The semiconductor layers 131 and 132 are insulated from the gate electrodes 152 and 155 by the gate insulating layer 140.

The switching TFT 10 may function as a switching element which selects a pixel to perform light emission. The switching gate electrode 152 may be coupled to the gate line 151, and the switching source electrode 173 may be coupled to the data line 171. The switching drain electrode 174 may be spaced apart from the switching source electrode 173 and may be coupled to one capacitor plate 158.

The driving TFT 20 may apply a driving power to the first electrode 210 serving as a pixel electrode, which allows the organic light emitting layer 230 of the OLED 200 in a selected pixel to emit light. The driving gate electrode 155 may be coupled to the capacitor plate 158 coupled to the switching drain electrode 174. The driving source electrode 176 and the other capacitor plate 178 may be respectively coupled to the common power line 172. The driving drain electrode 177 may be coupled to the first electrode 210 serving as the pixel electrode of the OLED 200 through a contact hole.

With the above-described structure, the switching TFT 10 may be operated by a gate voltage applied to the gate line 151, and may function to transmit a data voltage applied to the data line 171 to the driving TFT 20. A voltage equivalent to a difference between a common voltage (applied from the common power line 172 to the driving TFT 20) and the data voltage (transmitted from the switching TFT 10) may be stored in the capacitor 80, and a current corresponding to the voltage stored in the capacitor 80 may flow to the OLED 200 through the driving TFT 20, so that the OLED 200 may emit light.

According to the first embodiment, the first electrode 210 is an anode serving as a hole-injecting electrode and the second electrode 250 is a cathode serving as an electron-injecting electrode. However, embodiments of the present invention are not limited thereto, and thus the first electrode 210 may function as a cathode, and the second electrode 250 may function as an anode.

According to the first embodiment, the first electrode 210 may include a reflective layer and the second electrode 250 may include a transflective (e.g., transmissive, semi-transmissive, or transmissive and reflective) layer. Therefore, the light emitted from the organic light emitting layer 230 may be extracted through the second electrode 250. That is, the organic light emitting display 101 according to the first embodiment may be a top emission organic light emitting display.

One or more metals of magnesium (Mg), silver (Ag), gold (Au), calcium (Ca), lithium (Li), chromium (Cr), and aluminum (Al), or an alloy thereof may be used (utilized) to form the reflective layer or the transflective layer. In this case, whether the layer is the reflective layer or the transflective layer is determined by the thickness. In general, the transflective layer has a thickness of 200 nm or less. As the thickness of the transflective layer is reduced, the light transmittance increases, and as the thickness of the transflective layer is increased, however, the light transmittance is reduced.

In more detail, the first electrode 210 may include a reflective layer 211 including one or more metals of magnesium (Mg), silver (Ag), gold (Au), calcium (Ca), lithium (Li), chromium (Cr), copper (Cu), and aluminum (Al); and a transparent conductive layer 212 disposed on the reflective layer 211. That is, the first electrode 210 has a multi-layer structure including the reflective layer 211 and the transparent conductive layer 212. The transparent conductive layer 212 is disposed between the reflective layer 211 and the organic light emitting layer 230.

Transparent conductive oxides (TCO) may be used (utilized) to form the transparent conductive layer 212. The transparent conductive oxides (TCO) may include at least one of indium tin oxides (ITO), indium zinc oxides (IZO), zinc oxides (ZnO), aluminum zinc oxides (AZO), and indium oxides ($In_2O_3$). The transparent conductive layer 212 may have a relatively high work function. Therefore, in the case where the first electrode 210 has the transparent conductive layer 212, the hole injection through the first electrode 210 may be more actively carried out.

Further, the first electrode 210 may have a three-layer structure where the transparent conductive layer, the reflective layer, and the transparent conductive layer are sequentially laminated; or the first electrode 210 may be formed of only the transparent conductive layers.

The second electrode 250 may be formed of a semitransflective layer including one or more metals of magnesium (Mg), silver (Ag), gold (Au), calcium (Ca), lithium (Li), chromium (Cr), copper (Cu), and aluminum (Al).

A hole injection layer HIL 221 and a hole transporting layer HTL 222 may be disposed between the first electrode 210 and the organic light emitting layer 230, but the first embodiment of the present invention is not limited thereto. Thus, only one of the HIL 221 and the HTL 222 may be arranged between the first electrode 210 and the organic light emitting layer 230. Further, two layers of the HIL 221 may be included and two layers of the HTL 222 may be included. The HIL 221 and the HTL 222 may be omitted.

An electron transport layer ETL 241 and an electron injection layer EIL 242 may be disposed between the organic light emitting layer 230 and the second electrode 250, but the first embodiment is not limited thereto. Thus, only one of the ETL 241 and the EIL 242 may be arranged between the organic light emitting layer 230 and the second electrode 250. Further, two layers of the ETL 241 may be included and two layers of the EIL 242 may be included. The ETL 241 and the EIL 242 may be omitted.

A structure including the organic light emitting layer 230, the HIL 221, the HTL 222, the ETL 241, and the EIL 242 may be referred to as an organic layer. The organic layer may be made of low-molecular-weight organic materials or high-molecular-weight organic materials.

The low-molecular-weight organic materials may be used (utilized) in the HIL 221, the HTL 222, the organic light emitting layer 230, the ETL 241, and/or the EIL 242. The low-molecular-weight organic materials may have a single- or multi-layer laminated structure. In this case, examples of the suitable organic material include copper phthalocyanine (CuPc), N,N'-Di(naphthalene-1-yl)-N,N'-diphenyl-benzidine (NPB), tris-8-hydroxyquinoline aluminum (Alq3), and the like. The high-molecular-weight organic materials may be applied to the HTL 222 and/or the organic light emitting layer 230.

The pixel defining layer 190 may have an opening. A part of the first electrode 210 is exposed through the opening of the pixel defining layer 190. The first electrode 210, the organic light emitting layer 230, and the second electrode 250 may be sequentially laminated in the opening of the pixel defining layer 190. The second electrode 250 may be formed not only on the organic light emitting layer but also on the pixel defining layer 190. Further, the HIL 221, the HTL 222, the ETL 241, and the EIL 242 may be disposed between the pixel defining layer 190 and the second electrode 250. The OLED 200 may emit light from the organic light emitting layer 230 disposed in the opening of the pixel defining layer 190. Accordingly, the pixel defining layer 190 may define a light emitting area.

The non-resonance reflection inducing layer 300 may be disposed on the second electrode 250. The capping layer 400 is disposed on the non-resonance reflection inducing layer 300. The capping layer 400 is configured to protect the OLED 200 and may serve to efficiently emit light generated from the organic light emitting layer 230 to the outside.

The non-resonance reflection inducing layer 300 may have a lower refractive index than the capping layer 400.

As the refractive index of the non-resonance reflection inducing layer 300 is lower than that of the capping layer 400, an interface between the non-resonance reflection inducing layer 300 and the capping layer 400 may function as a reflective surface when the light emitted from the organic light emitting layer 230 is emitted to the outside. The reflectivity of the interface between the non-resonance reflection inducing layer 300 and the capping layer 400 may be increased in accordance with an increase in the refractive-index difference between the non-resonance reflection inducing layer 300 and the capping layer 400. In order to achieve the efficient interface reflection, the refractive-index difference between the non-resonance reflection inducing layer 300 and the capping layer 400 may be 0.3 or more.

The capping layer 400 is made of a material that may protect the OLED 200 by blocking external contaminants such as air, moisture and/or oxygen. Such a capping layer 400 has a refractive index of 1.6 to 3.0. In consideration of the refractive index of the capping layer 400, the non-resonance reflection inducing layer 300 may have a refractive index of 1.1 to 1.6.

The non-resonance reflection inducing layer 300 may be made of a material that has a low refractive index. For example, the non-resonance reflection inducing layer 300 may include at least one selected from $CaF_2$, NaF, $Na_3AlF_6$, SiOx, $AlF_3$, LiF, $MgF_2$, $Alq_3$[Tris(8-hydroxyquinolinato) aluminum], Balq[Bis(2-methyl-8-quinolinolato-N1,O8)-(1, 1'-Biphenyl-4-olato)aluminum], an acrylic resin, a polyimide-based resin and a polyamide-based resin.

Further, the non-resonance reflection inducing layer 300 may be formed of a thin film and may have a thickness of, for example, 3 nm to 30 nm. In one embodiment, the non-resonance reflection inducing layer 300 may have a thickness of 5 nm to 10 nm. As the thickness of the non-resonance reflection inducing layer 300 is small, the non-resonance reflection inducing layer 300 may not affect inside resonance structures of other parts of the organic light emitting display and may function as a low-refractive layer.

The capping layer 400 may have a thickness of 20 nm to 200 nm. In the case where the capping layer 400 has a thickness less than 20 nm, the capping layer 400 may not properly block the external contaminants such as air, moisture and/or oxygen. In contrast, in the case where the capping layer 400 has a thickness more than 200 nm, it may be difficult to achieve a thin film structure for the organic light emitting display and may lead to a high cost.

The capping layer 400 may include at least one selected from tris-8-hydroxyquinoline aluminum (Alq3), ZnSe, 2,5-bis(6'-(2',2"-bipyridyl))-1,1-dimethyl-3,4-diphenylsilole, 4'-bis[N-(1-napthyl)-N-phenyl-amion] biphenyl (α-NPD), N,N'-diphenyl-N,N'-bis(3-methylphenyl)-1,1'-biphenyl-4, 4'-diamine (TPD), and 1,1'-bis(di-4-tolylaminophenyl) cyclohexane (TAPC).

A thin film encapsulation layer may be further disposed on the capping layer 400 so as to protect the OLED 200. The thin film encapsulation layer may have a structure where at least one organic layer and at least one inorganic layer are alternately disposed, thereby reducing or preventing infiltration of the external contaminants such as air, moisture, and/or oxygen into the OLED 200.

Hereinafter, reflection and resonance inside the organic light emitting display 101 according to the first embodiment of the present invention will be described with reference to FIG. 3.

Figure 3:
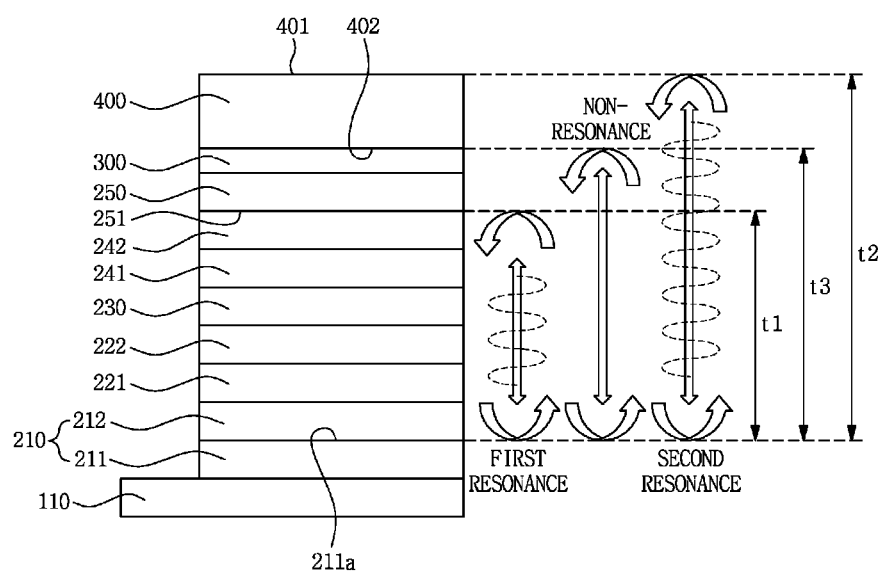
FIG. 3 is a mimetic view illustrating the organic light emitting display according to the first embodiment of the present invention.

FIG. 3 is a mimetic view illustrating the organic light emitting display according to the first embodiment of the present invention. FIG. 3 schematically illustrates an "A" part of FIG. 2. In FIG. 3, the lower part of the first electrode 210 may be simply depicted as the substrate 110.

The organic light emitting display 101 may have a multi-layer laminated structure. Further, a resonance structure is applied to this organic light emitting display 101, such that the ratio of the light extracted to the outside through the multi-layer laminated structure to the light generated from the organic light emitting layer 230 can be increased. That is, when light is repeatedly reflected between two reflective layers and when optical resonance occurs, light energy may be increased. The light with the increased energy may easily pass through the multi-layer structure and be extracted to the outside. Further, each of the layers composing the organic light emitting display may have a set or predetermined height (or thickness) in order to achieve an efficient optical resonance.

The organic light emitting display 101 according to the first embodiment includes the first electrode 210 including the reflective layer 211, and the second electrode 250 made of the transflective layer including a metal. Therefore, light may be easily reflected off the surface of the reflective layer 211 of the first electrode 210 and the surface of the second electrode 250. As a result, the organic light emitting display 101 according to the first embodiment may have a structure where the optical resonance occurs by adjusting the distance between an upper surface (facing towards the second electrode 250) 211a of the reflective layer 211 of the first electrode 210 and a lower surface (facing towards the first electrode 210) 251 of the second electrode 250.

For this purpose, the organic light emitting display 101 according to the first embodiment may be designed so that a distance t1 between the upper surface 211a of the reflective layer 211 and the lower surface 251 of the second electrode 250 is a multiple of the half wavelength of the light emitted from the organic light emitting layer 230.

In more detail, if the wavelength of light emitted from the organic light emitting layer 230 is λ1, and the distance between the upper surface 211a of the reflective layer 211 and the lower surface 251 of the second electrode 250 is t1, the organic light emitting display 101 according to the first embodiment may satisfy the following Formula 1.

$$t1=(n1\times\lambda1)/2, \quad \text{Formula 1}$$

wherein n1 is a natural number.

When such a condition is satisfied, the optical resonance may occur between the upper surface 211a of the reflective layer 211 and the lower surface 251 of the second electrode 250. Hereinafter, the optical resonance that occurs between the upper surface 211a of the reflective layer 211 and the lower surface 251 of the second electrode 250 is called "a first resonance." The light extraction efficiency of light extracted from the organic light emitting layer 230 to the outside is increased by this first resonance, thereby improving light efficiency of the organic light emitting display.

Further, the capping layer 400 may have a relatively high refractive index, and thus light may be reflected off the capping layer 400. Therefore, the organic light emitting display 101 according to the first embodiment may have a structure where the optical resonance occurs by adjusting the distance between the upper surface 211a of the reflective layer 211 of the first electrode 210 and an upper surface (facing away from the first electrode 210) 401 of the capping layer 400.

For this purpose, if the wavelength of light emitted from the organic light emitting layer 230 is λ1, and the distance between the upper surface 211a of the reflective layer 211 and the upper surface 401 of the capping layer 400 is t2, the organic light emitting display 101 according to the first embodiment satisfies the following Formula 2.

$$t2=(n2 \times \lambda 1)/2, \quad \text{Formula 2}$$

wherein n2 is a natural number.

When such a condition is satisfied, the optical resonance may occur between the upper surface 211a of the reflective layer 211 and the upper surface 401 of the capping layer 400. Hereinafter, the optical resonance that occurs between the upper surface 211a of the reflective layer 211 and the upper surface 401 of the capping layer 400 is called "a second resonance." The light extraction efficiency of light emitted from the organic light emitting layer 230 to the outside is increased by this second resonance, thereby improving light efficiency of the organic light emitting display.

Meanwhile, light may be reflected off a lower surface 402 (facing towards the first electrode 210) of the capping layer 400. The organic light emitting display 101 according to the first embodiment may have a structure where the optical resonance may not occur between the upper surface 211a of the reflective layer 211 of the first electrode 210 and the lower surface 402 of the capping layer 400.

For this purpose, the organic light emitting display 101 according to the first embodiment may include the non-resonance reflection inducing layer 300 disposed between the second electrode 250 of the OLED 200 and the capping layer 400. Further, the distance between the upper surface 211a of the reflective layer 211 of the first electrode 210 and the lower surface 402 of the capping layer 400 may be adjusted by adjusting the thickness of the non-resonance reflection inducing layer 300. Accordingly, the optical resonance may not occur between the upper surface 211a of the reflective layer 211 of the first electrode 210 and the lower surface 402 of the capping layer 400.

In more detail, if the wavelength of light emitted from the organic light emitting layer 230 is λ1, and the distance between the upper surface 211a of the reflective layer 211 and the lower surface 402 of the capping layer 400 is t3, the organic light emitting display 101 according to the first embodiment satisfies the following Formula 3.

$$(m1 \times \lambda 1)/2 < t3 < [(m1+1) \times \lambda 1]/2, \quad \text{Formula 3}$$

wherein m1 is a natural number.

In this case, the optical resonance may not occur between the upper surface 211a of the reflective layer 211 and the lower surface 402 of the capping layer 400. Such a case where the optical resonance does not occur by the reflection is referred to as the non-resonance reflection. Light subject to the non-resonance reflection may play a role in increasing light energy of the first or second resonance.

In the organic light emitting display 101 according to the first embodiment, the lower surface of the capping layer 400 becomes an interface between the non-resonance reflection inducing layer 300 and the capping layer 400.

In addition, each of the layers composing the OLED 200 and the capping layer 400 are required to have a set or predetermined thickness, so as to induce the first and second resonances. Therefore, the non-resonance reflection inducing layer 300 may have a thickness of 3 nm to 30 nm, for example, 5 nm to 10 nm, for a stable layer structure, such that the non-resonance reflection can occur at the lower part of the capping layer 400 without largely impacting the thickness and resonance structure of other layers.

Figure 4:
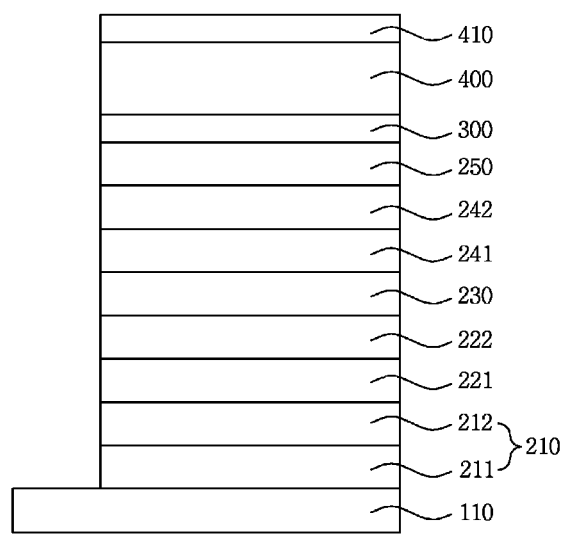
FIG. 4 is a mimetic view illustrating an organic light emitting display according to a second embodiment of the present invention.

Hereinafter, a second embodiment of the present invention will be described with reference to FIG. 4. FIG. 4 is a mimetic view illustrating an organic light emitting display 102 according to the second embodiment of the present invention. Herein, repeated descriptions of the same configurations of the first embodiment will not be provided for brevity.

The organic light emitting display 102 according to the second embodiment of the present invention may include a light extraction inducing layer 410 disposed on the capping layer 400. The light extraction inducing layer 410 has a refractive index between the refractive index of a layer disposed thereon (e.g., an upper layer) and the refractive index of the capping layer 400, thereby reducing or preventing a sudden change in the refractive index between the capping layer 400 and the upper layer. Accordingly, light passing through the capping layer 400 may be easily directed to the outside of the capping layer 400. For example, in the case where the upper part of the light extraction inducing layer 410 is an air layer (the refractive index=1), that is, the light passing through the capping layer 400 is directed to the air layer, the light extraction inducing layer 410 may have the refractive index of 1.1 to 1.6.

Hereinafter, the light extraction efficiency will be described with reference to FIGS. 5 to 7.

Figure 5:
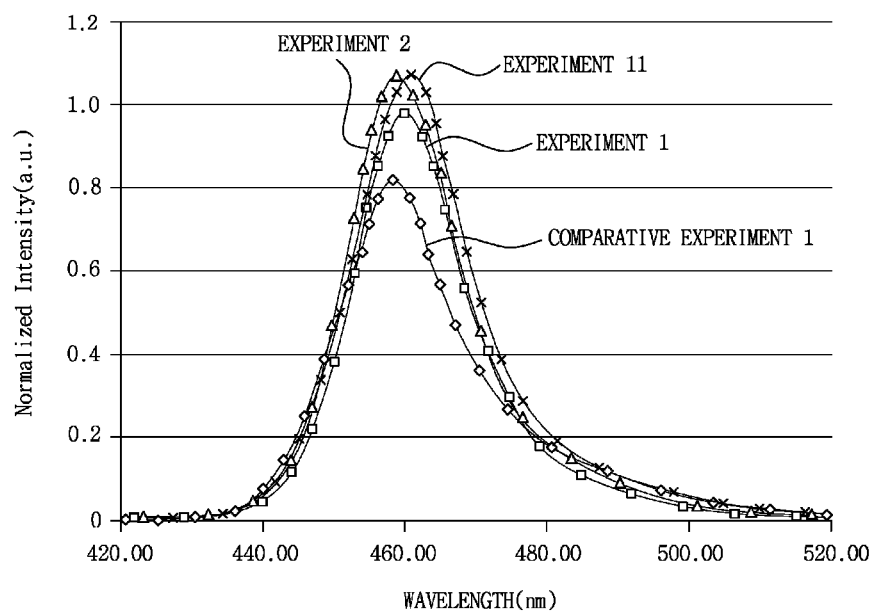
FIG. 5 is a graph illustrating a comparison of dependence of light extraction intensities on wavelength.

FIG. 5 is a graph illustrating a comparison of the dependence of light extraction intensities on wavelength. In more detail, FIG. 5 is a graph illustrating a simulation result of the light extraction intensities of the organic light emitting displays according to a Comparative Experiment 1 and Experiments 1, 2 and 11. The graph illustrates a comparison of the light extraction intensities on condition that a light extraction intensity value of Experiment 1 is normalized to "1" when the wavelength is 460 nm.

The Comparative Experiment 1 illustrates an organic light emitting display that includes the capping layer but does not include the non-resonance reflection inducing layer and the light extraction inducing layer. The Experiments 1 and 2 illustrate an organic light emitting display that includes the capping layer and the non-resonance reflection inducing layer but does not include the light extraction inducing layer. The Experiment 11 illustrates an organic light emitting display that includes the capping layer, the non-resonance reflection inducing layer, and the light extraction inducing layer.

Herein, the refractive indices of the capping layer, the non-resonance reflection inducing layer, and the light extraction inducing layer are 1.8, 1.5, and 1.5, respectively. Further, the thicknesses of the capping layer, the non-resonance reflection inducing layer, and the light extraction inducing layer according to the Experiments 1, 2, and 11 and the Comparative Experiment 1 are described in the following table 1.

TABLE 1

| Thickness | Experiment | | | |
|---|---|---|---|---|
| | Comparative Experiment 1 | Experiment 1 | Experiment 2 | Experiment 11 |
| Capping layer (nm) | 75 | 60 | 65 | 70 |
| Non-resonance reflection inducing layer (nm) | — | 5 | 5 | 5 |
| Light extraction inducing layer (nm) | — | — | — | 5 |

Figure 6:
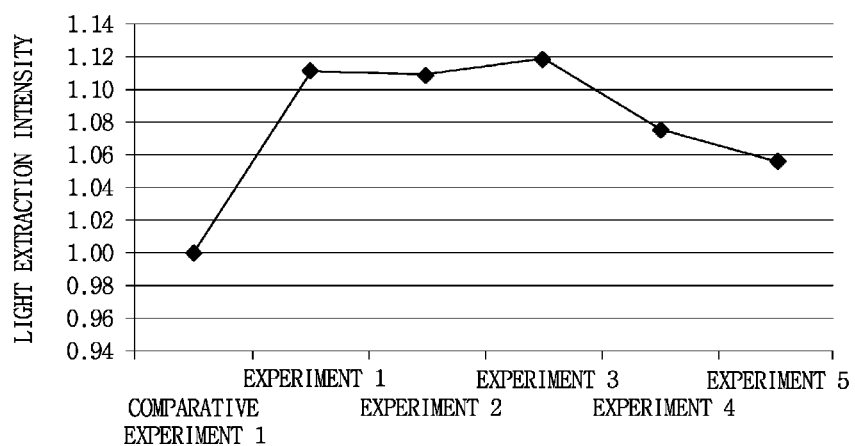
FIG. 6 is a graph illustrating a comparison of light extraction intensities of organic light emitting displays according to Comparative Experiment 1 and Experiments 1 to 5.

FIG. 6 is a graph illustrating a comparison of light extraction intensities of organic light emitting displays according to Comparative Experiment 1 and Experiments 1 to 5. In more detail, FIG. 6 is a graph illustrating light extraction intensities measured when the wavelength is 460 nm. The graph illustrates a comparison of the light extraction intensities on condition that a light extraction intensity value of Comparative Experiment 1 is normalized to "1."

Herein, the refractive indices of the capping layer and the non-resonance reflection inducing layer are 1.8 and 1.5, respectively. Further, the thicknesses of the capping layer and the non-resonance reflection inducing layer according to the Comparative Experiment 1 and Experiments 1 to 5 are described in the following table 2.

TABLE 2

| Thickness | Experiment | | | | | |
|---|---|---|---|---|---|---|
| | Comparative Experiment 1 | Experiment 1 | Experiment 2 | Experiment 3 | Experiment 4 | Experiment 5 |
| Capping layer (nm) | 75 | 60 | 65 | 70 | 75 | 80 |
| Non-resonance reflection inducing layer (nm) | — | 5 | 5 | 5 | 5 | 5 |

Figure 7:
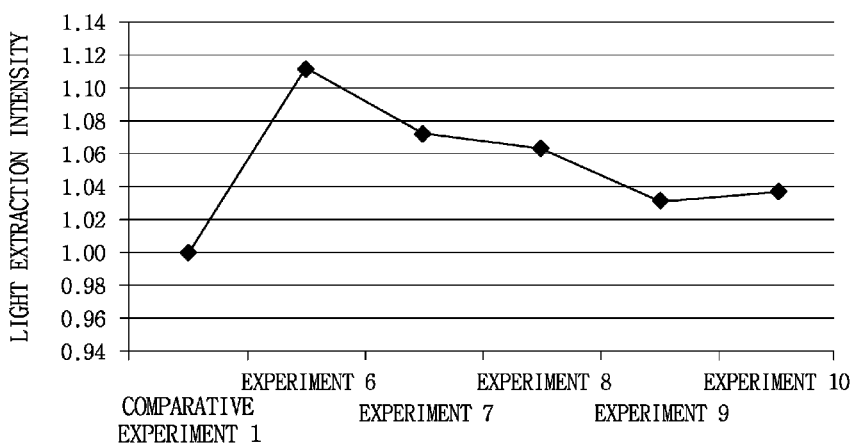
FIG. 7 is a graph illustrating a comparison of light extraction intensities of organic light emitting displays according to Comparative Experiment 1 and Experiments 6 to 10.

FIG. 7 is a graph illustrating a comparison of light extraction intensities of organic light emitting displays according to Comparative Experiment 1 and Experiments 6 to 10. Likewise, FIG. 7 is a graph illustrating light extraction intensities measured when the wavelength is 460 nm. The graph illustrates a comparison of the light extraction intensities on condition that the light extraction intensity value of Experiment 1 is normalized to "1" when the wavelength is 460 nm.

Herein, the refractive indices of the capping layer and the non-resonance reflection inducing layer are 1.8 and 1.5, respectively. Further, the thicknesses of the capping layer and the non-resonance reflection inducing layer according to the Comparative Experiment 1 and Experiments 6 to 10 are described in the following table 3.

TABLE 3

| Thickness | Experiment | | | | | |
|---|---|---|---|---|---|---|
| | Comparative Experiment 1 | Experiment 6 | Experiment 7 | Experiment 8 | Experiment 9 | Experiment 10 |
| Capping layer (nm) | 75 | 60 | 65 | 70 | 75 | 80 |
| Non-resonance reflection inducing layer (nm) | — | 10 | 10 | 10 | 10 | 10 |

Referring to FIGS. 5 to 7, compared to the Comparative Experiment 1 where the non-resonance reflection inducing layer is not disposed on the capping layer, the organic light emitting displays according to Experiments 1 to 11 where the non-resonance reflection inducing layer is disposed on the capping layer show improved light extraction intensity. That is, the light extraction efficiency of the organic light emitting displays according to Experiments 1 to 10 where the non-resonance reflection inducing layer is disposed on the capping layer is higher than the light extraction efficiency of the organic light emitting display according to the Comparative Experiment 1 where the non-resonance reflection inducing layer is not disposed on the capping layer While the present invention has been particularly shown and described with reference to exemplary embodiments thereof, it will be understood by one of ordinary skill in the art that various changes in form and details may be made therein without departing from the spirit and scope of the present invention as defined by the following claims and their equivalents.

What is claimed is:

1. An organic light emitting display comprising:
   a substrate;
   a first electrode on the substrate comprising a reflective layer;
   an organic light emitting layer on the first electrode;
   a second electrode on the organic light emitting layer;
   a non-resonance reflection inducing layer on the second electrode; and
   a capping layer on the non-resonance reflection inducing layer,
   wherein the first electrode, the second electrode and the capping layer are configured to subject light to resonance reflection at least one of:
   between an upper surface of the reflective layer facing the second electrode and a lower surface of the second electrode facing the reflective layer, and
   between the upper surface of the reflective layer and an upper surface of the capping layer, and
   wherein a lower surface of the capping layer facing the reflective layer and the upper surface of the reflective layer are configured to subject light to a non-resonance reflection between the lower surface of the capping layer and the upper surface of the reflective layer.

2. The organic light emitting display of claim 1, wherein the non-resonance reflection inducing layer has a refractive index of 1.1 to 1.5.

3. The organic light emitting display of claim 1, wherein the non-resonance reflection inducing layer has a thickness of 5 nm to 10 nm.

4. The organic light emitting display of claim 1, wherein the non-resonance reflection inducing layer comprises at least one selected from the group consisting of $CaF_2$, NaF, $Na_3AlF_6$, SiOx, $AlF_3$, LiF, $MgF_2$, $Alq_3$[Tris(8-hydroxyquinolinato)aluminum], an acrylic resin, a polyimide-based resin and a polyamide-based resin.

5. The organic light emitting display of claim 1, wherein a difference in refractive index between the non-resonance reflection inducing layer and the capping layer is 0.3 or more.

6. The organic light emitting display of claim 1, wherein the capping layer has a refractive index of 1.6 to 3.0.

7. The organic light emitting display of claim 1, wherein the capping layer has a thickness of 20 nm to 200 nm.

8. The organic light emitting display of claim 1, wherein the capping layer comprises at least one selected from the group consisting of tris-8-hydroxyquinoline aluminum (Alq3), ZnSe, 2,5-bis(6'-(2',2''-bipyridyl))-1,1-dimethyl-3,4-diphenylsilole, 4'-bis[N-(1-napthyl)-N-phenyl-amion] biphenyl (α-NPD), N,N'-diphenyl-N,N'-bis(3-methylphenyl)-1,1'-biphenyl-4,4'-diamine (TPD), and 1,1'-bis(di-4-tolylaminophenyl) cyclohexane (TAPC).

9. The organic light emitting display of claim 1, wherein the first electrode comprises the reflective layer and at least one transparent conductive layer on the reflective layer.

10. The organic light emitting display of claim 9, wherein the reflective layer comprises at least one of magnesium (Mg), silver (Ag), gold (Au), calcium (Ca), lithium (Li), chromium (Cr), copper (Cu) and aluminum (Al).

11. The organic light emitting display of claim 9, wherein the transparent conductive layer comprises at least one of indium tin oxides (ITO), indium zinc oxides (IZO), zinc oxides (ZnO), aluminum zinc oxides (AZO), and indium oxides (In2O3).

12. The organic light emitting display of claim 9, satisfying Formulas 1 and 2:

$$t1=(n1\times\lambda1)/2 \qquad \text{Formula 1}$$

$$t2=(n2\times\lambda1)/2, \qquad \text{Formula 2}$$

wherein a wavelength of light emitted from the organic light emitting layer is $\lambda1$, a distance between the upper surface of the reflective layer and the lower surface of the second electrode is t1, a distance between the upper surface of the reflective layer and the upper surface of the capping layer is t2, and n1 and n2 are natural numbers.

13. The organic light emitting display of claim 9, satisfying Formula 3:

$$(m1\times\lambda1)/2<t3<[(m1+1)\times\lambda1]/2, \qquad \text{Formula 3}$$

wherein a wavelength of light emitted from the organic light emitting layer is $\lambda1$, a distance between the upper surface of the reflective layer and the lower surface of the capping layer is t3, and m1 is a natural number.

14. The organic light emitting display of claim 1, further comprising at least one of a hole injection layer and a hole transport layer between the first electrode and the organic light emitting layer.

15. The organic light emitting display of claim 1, further comprising at least one of an electron transport layer and an electron injection layer between the organic light emitting layer and the second electrode.

16. The organic light emitting display of claim 1, further comprising a light extraction inducing layer on the capping layer.

17. The organic light emitting display of claim 1, further comprising a thin film encapsulation layer on the capping layer.

18. The organic light emitting display of claim 17, wherein the thin film encapsulation layer has a structure where a plurality of inorganic layers and a plurality of organic layers are alternately laminated.

\* \* \* \* \*